(12) United States Patent
Classon et al.

(10) Patent No.: US 6,856,657 B1
(45) Date of Patent: Feb. 15, 2005

(54) SOFT OUTPUT DECODER FOR CONVOLUTIONAL CODES

(75) Inventors: Brian K. Classon, Streamwood, IL (US); Terry M. Schaffner, Palatine, IL (US); Vipul A. Desai, Hoffman Estates, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/501,883

(22) Filed: Feb. 10, 2000

(51) Int. Cl.$^7$ ................................................ H04D 1/00
(52) U.S. Cl. ...................................... 375/341; 714/795
(58) Field of Search ................................ 375/316, 340, 375/341, 377, 365; 714/752, 795, 796

(56) References Cited

U.S. PATENT DOCUMENTS

| | | | |
|---|---|---|---|
| 5,442,627 A | | 8/1995 | Viterbi et al. ............... 370/22 |
| 5,933,462 A | | 8/1999 | Viterbi et al. ............... 375/341 |
| 6,598,204 B1 | * | 7/2003 | Giese et al. ............... 714/795 |
| 2002/0029362 A1 | * | 3/2002 | Stephen et al. ............. 714/752 |

FOREIGN PATENT DOCUMENTS

EP          1122890 A2    8/2001

OTHER PUBLICATIONS

Bahl et al., "Optimal Decoding of Linear Codes for Minimizing Symbol Error Rate", IEEE Trans. Inform. Theory, vol. IT–20, Mar. 1974, pp. 284–7.

Benedetto et al., "Algorithm for Continuous Decoding of Turbo Codes", Electronics Letters, vol. 32, Feb. 15, 1996, pp. 314–5.

Pietrobon et al., "A Simplification of the Modified Bahl Decoding Algorithm for Systematic Convolutional Codes", Int. Symp. On Inform. Theory and its Applications, Sydney, Australia, Nov. 1994, Revised Jan. 4, 1996, pp. 1073–7.

Pietrobon et al., "A Simplification of the Modified Bahl et al. Decoding Algorithm for Systematic Convolutional Codes", Int. Symp. On Inform. Theory and its Applications, Sydney, Australia, Nov. 1994.

Pietrobon, Steven, "Efficient Implementation of Continuous MAP Decoders and a Synchronous Technique for Turbo Decoders", Int. Symp. On Inform. Theory and its Applications, Victoria, BC, Canada, Sep. 1996, pp. 586–9.

Viterbi, Andrew, "An Intuitive Justification and a Simplified Implementation of the MAP Decoder for Convolution Codes", IEEE Journal on Select. Areas Commun., vol. 16, No. 2, Feb. 1998, pp. 260–4.

Berrou et al. "Near Shannon Limit Error–Correcting Coding and Decoding: Turbo–Codes(1)", Proc. ICC, 1993, pp. 1064–70.

Ariel et al. "Soft Syndrome Decoding of Binary Convolutional Codes", IEEE Trans. Communications, vol. 43, No. 2, Apr. 1995, pp. 288–97.

* cited by examiner

*Primary Examiner*—Kevin Burd
(74) *Attorney, Agent, or Firm*—Brian M. Mancini; Randall S. Vaas

(57) ABSTRACT

Decoding signals represented by a trellis of block length N divided into windows of length L includes a step of decoding a forward recursion from a point P1 that is before the beginning of a window up to the beginning of the window and decoding a backward recursion from a point P2 that is after the end of a window back to the end of the window to define known states at the beginning and end of the window. A next step includes decoding the window using backward recursion from the known state at the end of the window back to the beginning of the window to define a set of backward recursion state metrics. A next step includes decoding using forward recursion starting from a known state at the beginning of the window and moving forward to the end of the window to define a set of forward recursion state metrics. A next step includes calculating a soft output at each stage of the window using the forward and backward recursion state metrics, and branch metrics at each stage, and outputting the soft output for that stage.

21 Claims, 5 Drawing Sheets

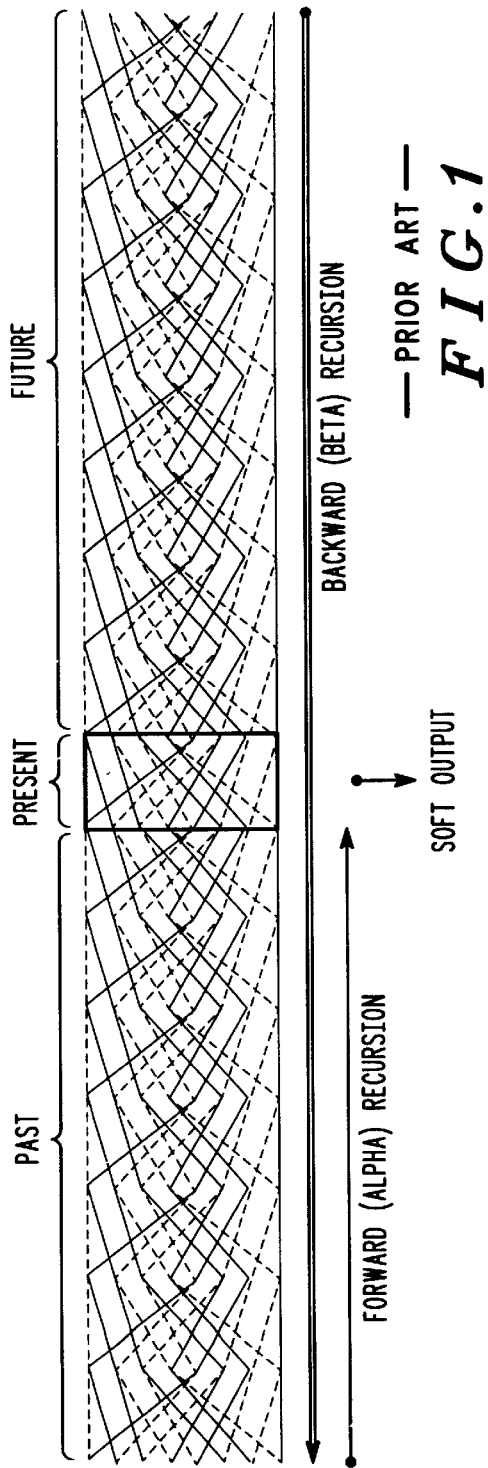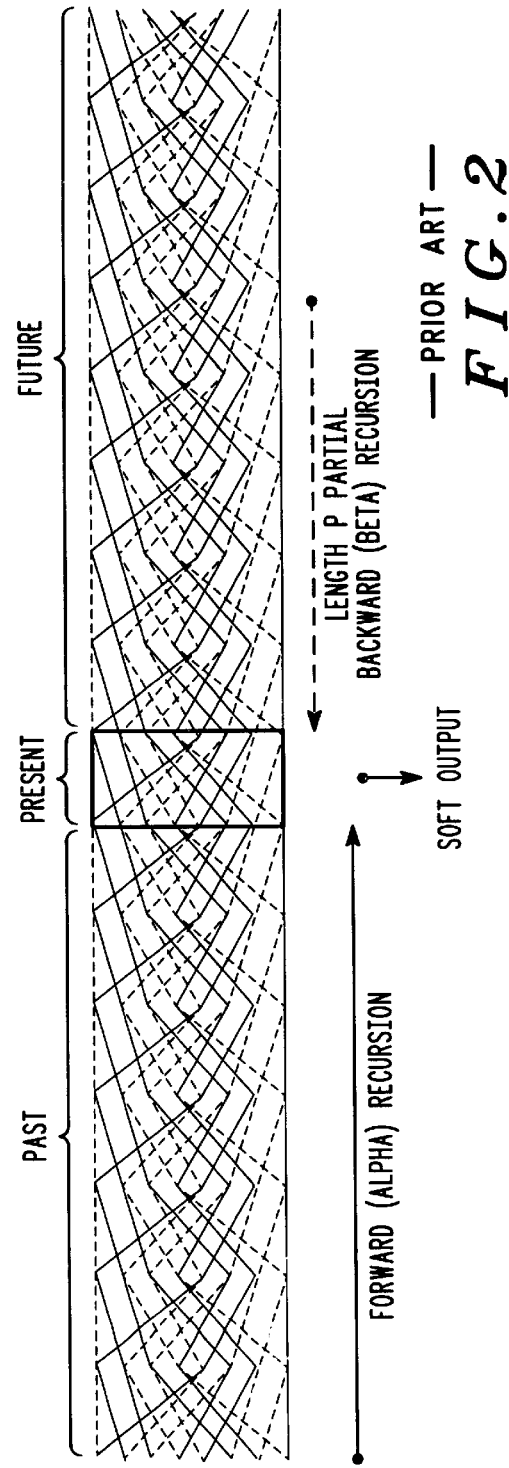

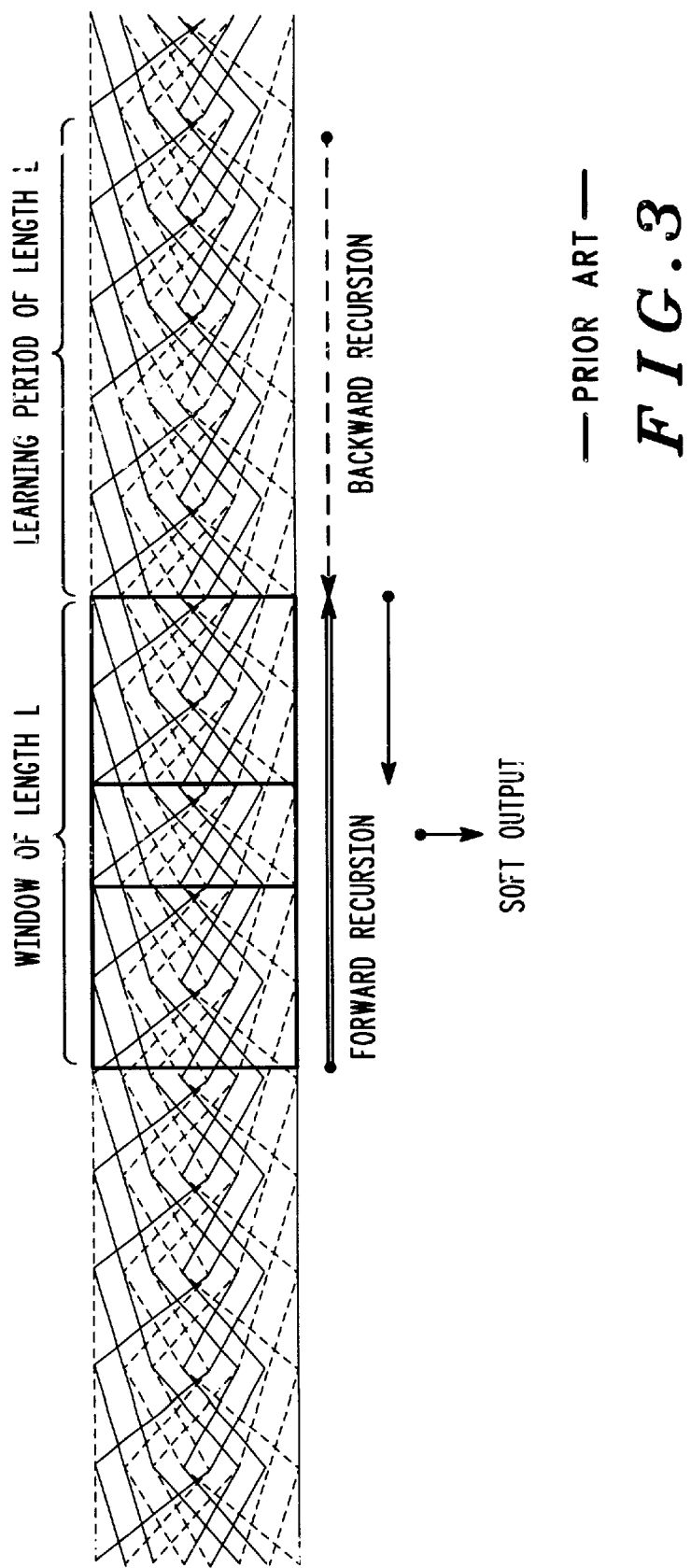
FIG. 3 — PRIOR ART —

SOFT OUTPUT DECODER FOR CONVOLUTIONAL CODES

CROSS REFERENCE TO RELATED APPLICATIONS

This application is related to U.S. patent applications, Ser. No. 09/500,189 by inventors Desai and Classon, Ser. No. 09/502,132 by inventors Classon, Schaffner, Desai, Baker and Friend, and Ser. No. 09/501,911 by inventors Classon and Schaffner. The related applications are filed on even date herewith, are assigned to the assignee of the present application, and are hereby incorporated herein in their entirety by this reference thereto.

FIELD OF THE INVENTION

This invention relates generally to communication systems, and more particularly to a soft output decoder for use in a receiver of a convolutional code communication system.

BACKGROUND OF THE INVENTION

Convolutional codes are often used in digital communication systems to protect transmitted information from error. At the transmitter, an outgoing code vector may be described using a trellis diagram whose complexity is determined by the constraint length of the encoder. Although computational complexity increases with increasing constraint length, the robustness of the coding also increases with constraint length.

At the receiver, a practical soft-decision decoder, such as a Viterbi decoder as is known in the art, uses a trellis structure to perform an optimum search for the maximum likelihood transmitted code vector. The Viterbi algorithm, however, is computationally complex, and its complexity increases exponentially with increasing constraint length. This essentially means that a Viterbi decoder requires a significant amount of memory and processing power for convolutional codes with large constraint lengths.

Coders for various communications systems, such as Direct Sequence Code Division Multiple Access (DS-CDMA) standard IS-95 and Global System for Mobile Communications (GSM), have such large constraint lengths. For example, the GSM half-rate constraint length K=7 and the IS-95 constraint length K=9.

Another disadvantage of Viterbi decoders is that a fixed number of computations must be performed for each code vector, irrespective of the actual number of errors that occurred during transmission. Thus, a Viterbi decoder processes a received signal having few transmission errors or no errors at all using the same number of computations as a received signal having many errors.

More recently, turbo codes have been developed that outperform conventional coding techniques. Turbo codes are generally composed of two or amore convolutional codes and turbo interleavers. Turbo decoding is iterative and uses a soft output decoder to decode the individual convolutional codes. The soft output decoder provides information on each bit position which helps the soft output decoder decode the other convolutional codes. The soft output decoder is usually a MAP (maximum a posterior) decoder which requires backward and forward decoding to determine the soft output. However, because of memory, processing, and numerical tradeoffs, MAP decoding is usually limited to a sub-optimal approximation. All of these variants require both forward and backward decoding over the block.

For future standards, such as the 3GPP (third generation partnership project for wireless systems), an 8-state turbo code with a block length of N=5120, needs 40960 words of intermediate storage which may be unacceptable. Future systems (larger frame and greater number of states) will require even more memory. By comparison, a Viterbi decoder that does not produce soft outputs for an N=5120, 8-state trellis requires less than 100 words of intermediate.

There is a need for a soft output decoder that reduces overall memory and processing requirements for decoding convolutional codes without the degree of limitations imposed by prior art turbo and MAP decoders.

BRIEF DESCRIPTION OF THE DRAWINGS

FIG. 1 shows a trellis diagram for a first prior art soft output decoder technique;

FIG. 2 shows a trellis diagram for a second prior art soft output decoder technique;

FIG. 3 shows a trellis diagram for a third prior art soft output decoder technique;

DETAILED DESCRIPTION OF THE PREFERRED EMBODIMENT

Figure 4:
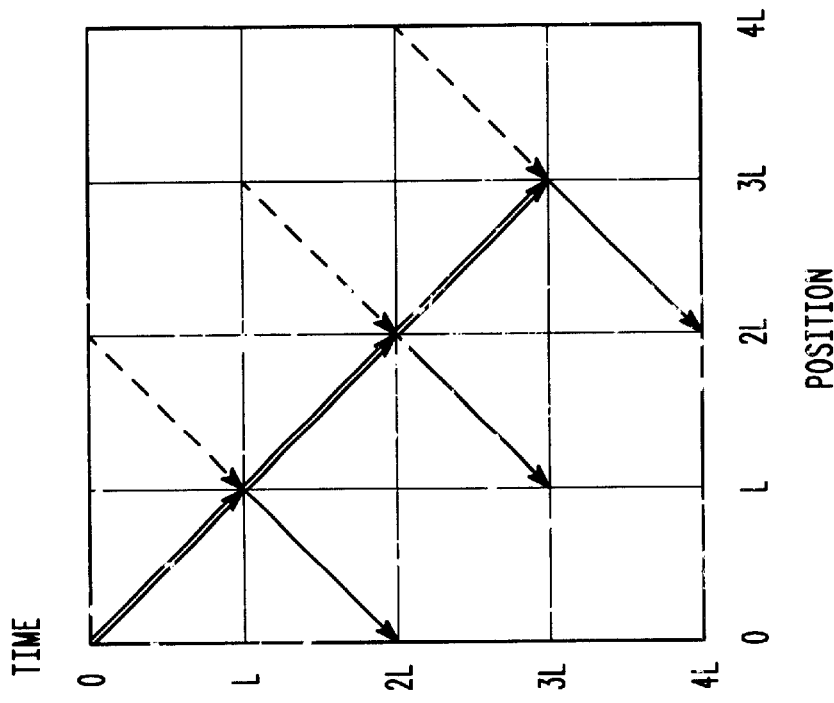
FIG. 4 shows an expanded graphical representation of the diagram of FIG. 3.

The present invention greatly reduces the memory requirement from prior art turbo decoders with only a small increase in computation over a Viterbi decoder. In all, this provides for a more efficient decoder. Moreover, the present invention minimizes the limitations of prior art turbo and MAP decoders.

Typically, block codes, convolutional codes, turbo codes, and others are graphically represented as a trellis as shown in FIG. 1. Maximum a posteriori type decoders (log-MAP, MAP, max-log-MAP, constant-log-MAP, etc.) utilize forward and backward generalized Viterbi recursions on the trellis in order to provide soft outputs, as is known in the art. The MAP decoder minimizes the decoded bit error probability for each information bit based on all received bits. Typical prior art MAP decoders require a memory for use in decoding.

Because of the Markov nature of the encoded sequence (wherein previous states cannot affect future states or future output branches), the MAP bit probability can be broken into the past (beginning of trellis to the present state), the present state (branch metric for the current value), and the future (end of trellis to current value). More specifically, the MAP decoder performs forward and backward recursions up to a present state wherein the past and future probabilities are used along with the present branch metric to generate an output decision. The principles of providing hard and soft output decisions are known in the art, and several variations of the above described decoding methods exist.

Most of the soft input-soft output SISO decoders considered for turbo codes are based on the prior art MAP algorithm in a paper by L. R. Bahl, J. Cocke, F. Jelinek, and J. Raviv entitled "Optimal Decoding of Linear Codes for Minimizing Symbol Error Rate", IEEE Transactions on Information Theory, Vol. IT-20, March 1974, pp. 284–7 (BCJR algorithm). FIG. 1 shows a trellis diagram for this algorithm for an 8-state convolutional code, which can be used in a turbo code. As should be recognized, turbo coders are constructed with interleavers and constituent codes which are usually systematic convolutional codes, but can be block codes also. MAP algorithms not only minimize the probability of error for an information bit given the received sequence, they also provide the probability that the information bit is either a 1 or 0 given the received sequence. The BCJR algorithm provides a soft output decision for each bit position (trellis section) wherein the influence of the soft inputs within the block is broken into contributions from the past (earlier soft inputs), the present soft input, and the future (later soft inputs). This decoder algorithm requires a forward and a backward generalized Viterbi recursion on the trellis to arrive at an optimal soft output for each trellis section (stage). These a posteriori probabilities, or more commonly the log-likelihood ratio (LLR) of the probabilities, are passed between SISO decoding steps in iterative turbo decoding. The LLR for information bit $u_t$ is $$\Lambda_t = \log \frac{\sum_{(m,n) \in B^1} \alpha_{t-1}(n) \gamma_t(n, m) \beta_t(m)}{\sum_{(m,n) \in B^0} \alpha_{t-1}(n) \gamma_t(n, m) \beta_t(m)}, \quad (1)$$

for all bits in the decoded sequence (t=1 to N). In equation (1), the probability that the decoded bit is equal to 1 (or 0) in the trellis given the received sequence is composed of a product of terms due to the Markov property of the code. The Markov property states that the past and the future are independent given the present. The present, $\gamma_t(n,m)$, is the probability of being in state m at time t and generating the symbol $y_t$ when the previous state at time t−1 was n. The present plays the function of a branch metric. The past, $\alpha_t(m)$, is the probability of being in state m at time t with the received sequence $\{y_1 \ldots, y_t\}$, and the future, $\beta(m)$, is probability of generating the received sequence $\{y_{t+1}, \ldots y_N\}$ from state m at time t. The probability $\alpha_t(m)$ can be expressed as function of $\alpha_{t-1}(m)$ and $\gamma_1(n,m)$ and is called the forward recursion $$\alpha_t(m) = \sum_{n=0}^{M-1} \alpha_{t-1}(n) \gamma_t(n, m), \quad m = 0, \ldots, M-1, \quad (2)$$

where M is the number of states. The reverse or backward recursion for computing the probability $\beta_t(n)$ from $\beta_{t+1}(n)$ and $y_1(n,m)$ is $$\beta_t(n) = \sum_{m=0}^{M-1} \beta_{t+1}(m) \gamma_t(n, m), \quad n = 0, \ldots, M-1. \quad (3)$$

The overall a posteriori probabilities in equation (1) are computed by summing over the branches in the trellis $B^1$ ($B^0$) that correspond to $u_t=1$ (or 0).

The LLR in equation (1) requires both the forward and reverse recursions to be available at time t. The BCJR method for meeting this requirement is to compute and store the entire reverse recursion, and recursively compute $\alpha_t(m)$ and $\Lambda_t$ from t=1 to t=N using $\alpha_{t-1}$ and $\beta_t$.

The disadvantage of this decoder is that the entire block of N stages must first be stored in memory before processing. Not only does this requires a large memory (N sections x M states x number of bits per state), this also causes a signal delay of length N before any information can possibly be output. In a W-CDMA system (N~5000, M=8, 13 bits) the memory required is about 0.5 Mbits. In a cdma2000 system, N is approximately 20000 which requires a memory of about 2 Mbits. For small sequence lengths, memory utilization is generally not an issue. However, for the large N where turbo codes perform the best, memory utilization is significant.

In terms of complexity, the BCJR method requires NM state updates for the reverse recursion (M state updates per trellis section, N trellis sections in the code) and provides optimal performance. In practice, a backward recursion is performed by a processor across the entire block (as shown in FIG. 1) and stored in memory. Then a forward recursion is performed by the processor and the result is used with the present state and stored future state to arrive at a soft output decision for each stage. In this case the processor operates on each state twice, once to store the backward recursion states, and once during forward recursion processing (throughput of ½).

To address the memory utilization problem, a sliding window method and similar variations were developed. In the sliding window technique, described in a paper by S. Benedetto, D. Divsalar, G. Montorsi, and F. Pollara, entitled "Algorithm for continuous decoding of turbo codes," Electronics Letters, Vol. 32, Feb. 15, 1996, pp. 314–5, as represented in FIG. 2 (in the figures that follow a solid arrow represents an output provided with recursion but no storage, a dotted arrow represents a learning period with no output and no storage, and a hollow arrow represents a stored recursion with no output, with the direction of the arrows indicating forward or backward recursions). An assumption that all states at time t+P are equally probable (or unknown) is used for the reverse recursion. To use this assumption, the learning period P must be several constraint lengths of the constituent code in order to provide near-optimal performance. Making the learning period too small can introduce noticeable performance degradation, similar to the effects of 'finite' traceback in the conventional Viterbi algorithm.

The sliding window technique does not require any memory, but is computationally complex. Specifically, instead of an entire backward recursion being performed and stored, only a partial backward recursion is performed (and not stored) to determined each state. For each present state, the algorithm initializes the future recursion at a learning period of P away from the present state with the initial state unknown. The future probabilities are calculated backward from the unknown future point, not from the known end of the trellis. The length P (learning period) is set such that by the time the partial backward recursion reaches the present state, the future probabilities are most likely correct. P depends on the rate and constraint length of the code and the expected channel conditions. For example, given an 8-state decoder with a ½ rate convolutional code, P is typically between 16 to 32, wherein P is some multiple of constraint lengths. The disadvantage of this decoder is that the partial backward recursion is started with equally likely (unknown states) and is allowed to iterate until it reaches the present window. This is a sub-optimal algorithm as the sliding window causes degradation from true MAP performance, similar to the effects of finite traceback in a conventional Viterbi algorithm, increasing the probability of decoded bit error. Also, the processor operates on each state P times (throughput of 1/P) and has a output delay of P. Moreover, this algorithm requires P times the complexity which can only be reduced by adding more processing.

The sliding window method can be summarized as, for t=1 to N, compute the reverse recursion starting at time t+P to time t, and compute $\alpha_t(m)$ and $\Lambda_t$ from $\alpha_{t-1}(m)$ and $\beta_t$. The sliding window method reduces the memory requirement from NM as needed in the BCJR method down to an insignificant amount of memory needed for a recursion. Assuming double buffering, the amount of memory is only 2M, and can be safely ignored in the analysis.

However, to achieve this memory saving, the computational complexity for the backward recursion increases by a factor of P. The sliding window method is also sub-optimal due to the 'finite' window size.

Another prior art decoder, described in U.S. Pat. No. 5,933,462 to Viterbi et al. (and similarly in a paper of S. Pietrobon and S. Barbulescu, "A Simplification of the Modified Bahl et al. Decoding Algorithm for Systematic Convolutional Codes," Int. Symp. On Inform. Theory and its Applications, Sydney, Australia, pp. 1073–7, Nov. 1994, revised Jan. 4, 1996 and S. Pietrobon, "Efficient Implementation of Continuous MAP Decoders and a Synchronisation Technique for Turbo Decoders," Int. Symp. On Inform. Theory and its Applications, Victoria, B.C., Canada, pp. 586–9, September 1996) describes another sliding window technique, as represented in FIG. 3.

The Viterbi sliding window method reduces the large increase in computational complexity of the prior art sliding window method by performing processing in blocks. The reverse recursion is started at time t+2L, and the reverse recursion values are stored from time t+L to time t. The forward recursion and output likelihood computation are then performed over the block of time t to time t+L. Memory is reduced from NM down to L M, while only doubling the computational complexity. The key observation of starting the recursion in an unknown state is the same as for the sliding window technique.

This technique requires some memory and is still computationally complex. The decoder differs from the previously described sliding window technique by providing a window that slides forward in blocks rather than a symbol at a time. Specifically, a sliding window is defined having a length L which is equal to the previously described learning period P. Also, L is some multiple of the total trellis length, N, and the window slides from the beginning to the end of the trellis in steps of length L. In this way, the memory required in prior art decoders, where the entire trellis was stored, has been reduced from N to N/L (typically 3 kbits for cdma2000 and W-CDMA systems where L=32).

This decoder also uses a learning period starting from an unknown future state and is therefore sub-optimal as described previously. Specifically, a forward recursion is performed by the processor starting from a known state at the beginning of a first window L and over the length (L) of the first window. These forward recursion states are stored. The processor then performs a backward recursion from an unknown state starting at a point that is 2L away from where the forward recursion started so as to define a known state at the end of the first window. Then the processor performs a second backward recursion starting from the known state at the end of the first window to the present state wherein information from the backward recursion and the stored forward recursion are used to generate the soft output. Once all the outputs of the first window are determined the window slides forward an amount L and the process is repeated starting from the state that was determined at the end of the first window.

The disadvantage of this decoder is that the first backward recursion over the learning period, L, is started with equally likely (unknown states) and is allowed to iterate over the length L which is sub-optimal as previously described. Also, the processor operates on each state three times although a forward and backward processor can be run concurrently such that the throughput of ½ is obtained. The decoder produces an output delay of 2L. Moreover, the backward recursion requires twice the complexity which can only be reduced (or the throughput increased) by adding more processing. Further, this decoder produces soft outputs in reverse order which would need to be buffered in a supplementary memory before being output.

FIG. 4 shows an expanded diagram of the graph of FIG. 3 with a time component added. In operation, at time 0 a forward processor performs a forward recursion over a first window from position 0 to L and stores the information while over the same time period a backward processor performs a backward recursion from position 2L to L to define a known state at the end of the first window at position L at time L. Thereafter, a second backward recursion operates from time L to 2L over position L to 0 to define the soft outputs over the first window. At this time, the soft decisions can now be reversed and output in order (which clearly occurs after a delay of 2L), the memory is cleared, the window position slides forward a length of L, and the process repeats. Alternatively, with an additional backward recursion processor and memory, throughput can be increased.

Figure 5:
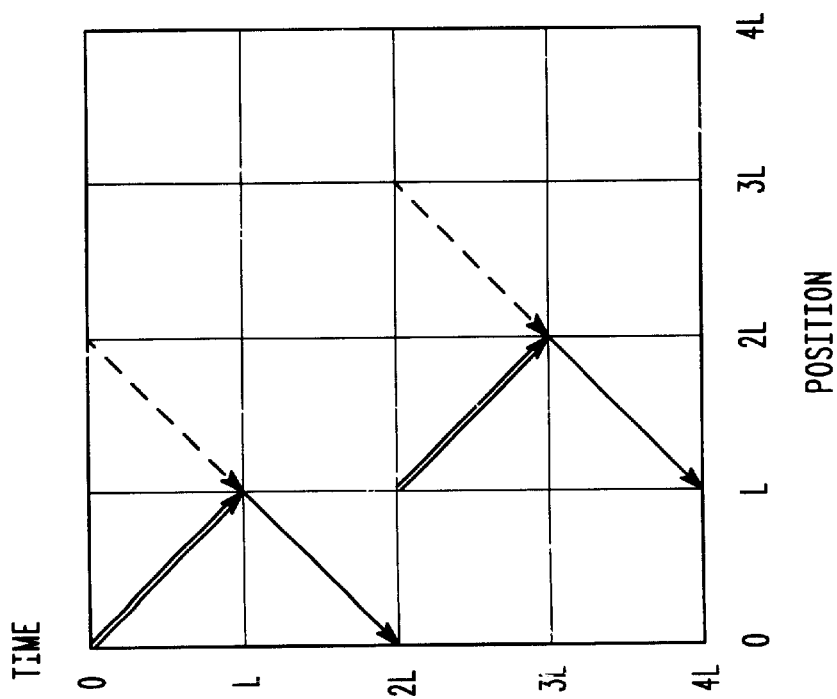
FIG. 5 shows an alternate expanded graphical representation of the diagram of FIG 3.

FIG. 5 shows an alternative result for the graph of FIG. 3 using an additional backward processor. In operation, at time 0 the forward processor performs a forward recursion over a first window from position 0 to L and stores the information while over the same time period the backward processor performs a backward recursion from position 2L to L to define a known state at the end of the first window at position L at time L. Thereafter, a second backward recursion operates from time L to 2L over position L to 0 to define the soft outputs over the first window. At the same time, the forward and additional backward processor start a second cycle by beginning to process information the second window (from position L to 2L). At time 2L, the soft decisions for the first window are output while the forward recursion and backward learning period for the second window have already been completed. Then a second backward recursion for the second window is performed to obtain the soft outputs for the second window. As can be seen, this technique doubles the throughput. Twice the memory is needed as the information of the forward recursion for the first window is being used while the forward recursion for the second window is being stored.

The above decoders (specifically of FIGS. 4 and 5) suffer from the problem of the soft outputs being produced out of order requiring their reversal before being output. This requires additional buffer memory and produces an additional delay to reverse the outputs.

Figure 6:
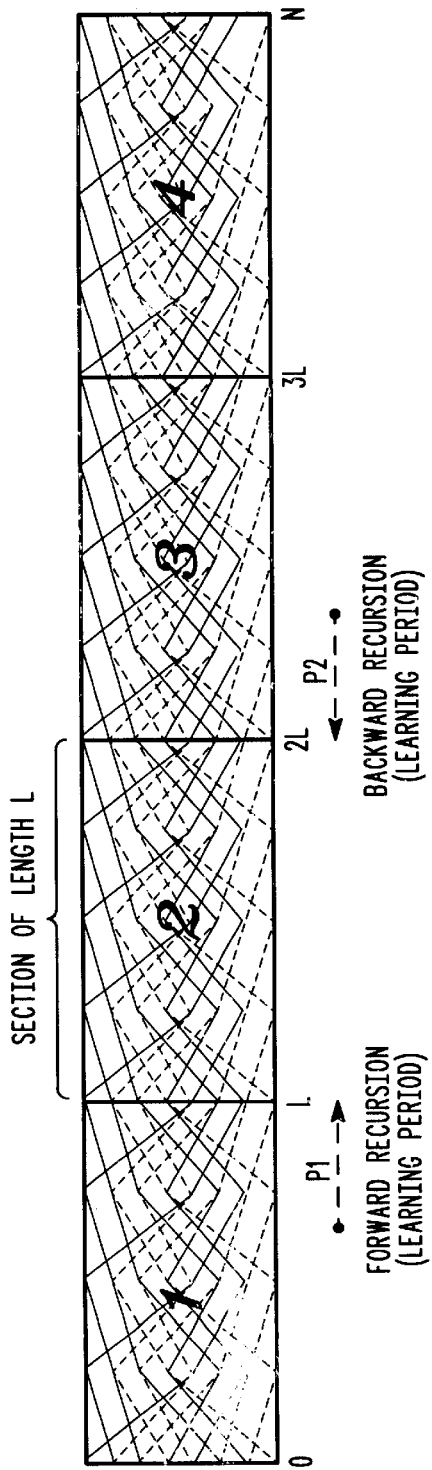
FIG. 6 shows a trellis diagram for a soft output decoder technique in accordance with the present invention.
Figure 7:
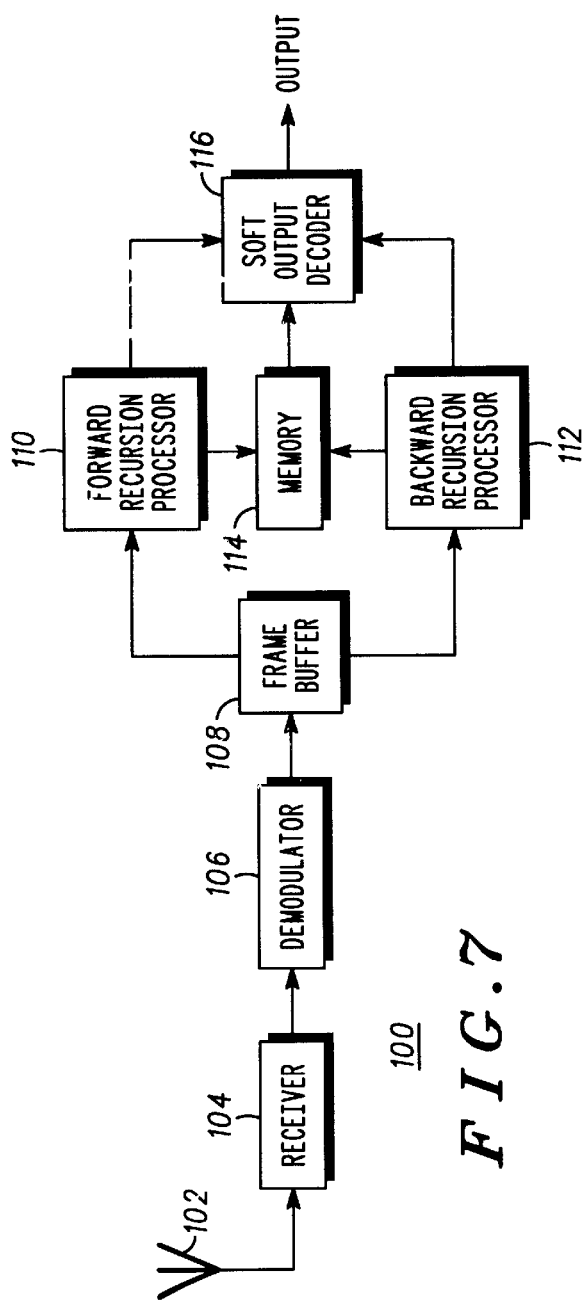
FIG. 7 shows a block diagram of a soft output decoder, in accordance with the present invention.

The present invention solves this problem in a novel way. In addition, the present invention provides the high throughput needed in a future broadband communication system required to process many Mbps. FIG. 6 shows a trellis diagram utilizing convolutional decoding in accordance with the present invention. The trellis code is obtained from a convolutionally coded sequence of signals represented by a trellis of length N in a communication system, as simplified in FIG. 7. In a radiotelephone 100, a signal travels through an antenna 102 to a receiver 104 and demodulator 106, as is known in the art. The signal is loaded into a frame buffer 106. A forward recursion processor 110 and backward recursion processor 112 operate on the block.

The present invention differs from the previously described sliding window technique of FIGS. 3–5 by providing windows that can be decoded independently (non-sliding) without relying on state information being passed from window to window as is done in the prior art. Although the window sizes are not required to be equal throughout the trellis, it is assumed that they are equal for purposes of explanation. In particular, a window is defined having a length L such that some multiple or function of L equals the total trellis length, N. A forward learning period of distance P1, starting from an unknown past state is used to define the forward state metric at the beginning of the window, and a backward learning period of distance P2, starting from an unknown future state is used to define the backward state metric at the end of the window. The present invention is sub-optimal as described previously since learning periods and state approximations are used. The learning periods are assumed to be equal for purposes of explanation, but the learning periods are not required to be all equal. For example, in those cases where the code is punctured more at one end of a trellis than the other, this will likely require a longer learning period for equal performance.

Specifically, a forward learning recursion is performed by the forward processor 110 starting from an unknown state that is length P1 before the beginning of a window up to the beginning of the window to approximate and define a known state at the beginning of that window, and a backward learning recursion is performed by the backward processor 112 starting from an unknown state that is length P2 beyond the end of a first window backward to the end of the first window to approximate and define a known state at the end of that window. The forward and backward learning periods need not be equal to L or to each other. Further, although it is preferred that the learning period is equal to at least some multiple of constraint lengths, the window length need not be. Preferably, P1=P2 and both are much less than L.

Within the window, backward and forward recursions are perform, in accordance with prior art techniques to define all the state metrics within the window. Typically, the information from the backward recursion and forward recursion, which can be stored in memory 114, is used along with the present branch metric in the decoder 116 to generate soft output decisions. The soft outputs from the decoder 116 are generated in accordance with known turbo coding techniques, such as those represented in the Bahl et al. paper (BCJR algorithm) cited above.

At the end of processing the window, any other window can be chosen to be processed as the beginning and end states for each window are reappoximated without depending on previously defined state information being transferred from adjacent windows. As a result, in a preferred embodiment, all of the windows can be processed independently by separate processors at the same time to develop a decoder throughput of about N/L times the throughput of the prior art decoder. Of course, there is an exception for the first and last windows since the beginning and end states of the block are usually already known. Therefore, those corresponding learning periods are not needed.

The advantage of the present invention is that the windows need not be processed in order and can be processed in parallel increasing efficiency by an order of N/L. The memory requirements are dependent on which decoding method is used within the window.

Figure 8:
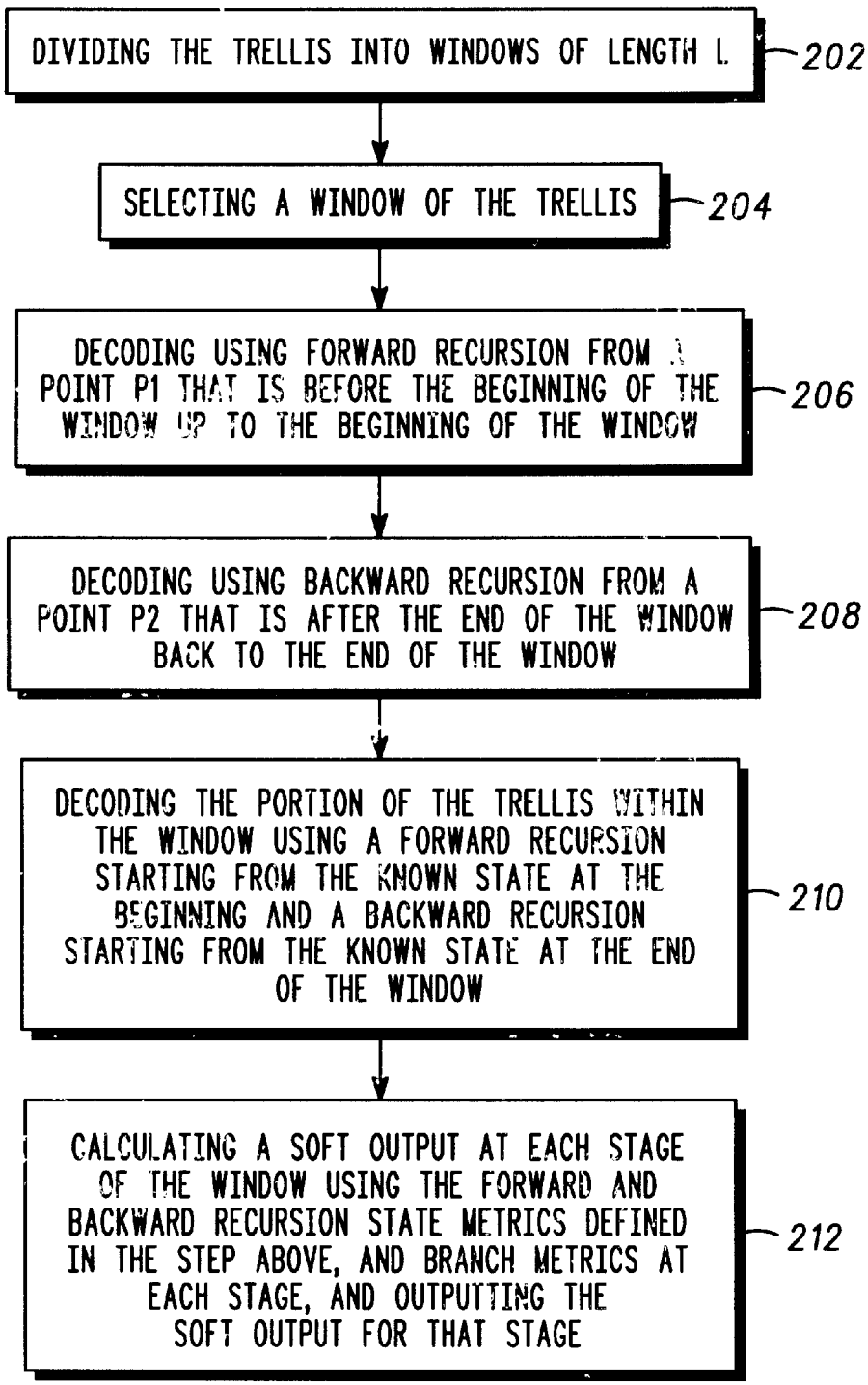
FIG. 8 a flow chart of a soft output decoder method, in accordance with the present invention.

FIG. 8 shows a flow chart representing a method 200 of decoding a received convolutionally coded sequence of signals represented by a trellis of block length N, in accordance with the present invention (also see FIG. 6). Trellis diagrams are well known in the art. A first step 202 is dividing the trellis into windows of length L. A next step 204 is selecting a window of the trellis. A next step 206 is decoding a portion of the trellis using forward recursion from a point P1 that is before the beginning of the window up to the beginning of the window, wherein P1 is chosen at a sufficient distance from the beginning of the window such that forward recursion determines a known state metric at the beginning of the window. A next step 208 is decoding a portion of the trellis using backward recursion from a point P2 that is after the end of the window back to the end of the window, wherein P2 is chosen at a sufficient distance from the end of the window such that backward recursion determines a known state metric at the end of the window. In general, the state metrics at points P1 and P2 will be unknown and the recursions using a generalized Viterbi algorithm will converge to a known state at the window with a high probability. P1 and P2 are some function of the constraint length of the convolutional code. Both P1 and P2 can be much less than the length L, and in a preferred embodiment, P1 equals P2. A next step 210 is decoding the portion of the trellis within the window using a generalized Viterbi algorithm. A next step 212 is calculating a soft output at each stage of the forward recursion process using the forward recursion state metrics, the branch metrics, and the stored backward recursion state metrics, and outputting the soft output for that stage. Preferably, the recursion updates and soft outputs are calculated using a MAP algorithm or one of the MAP derivatives (i.e., log-MAP, max-log-MAP, constant-log-MAP, etc.).

Once a window is completely decoded, any other window is chosen to be decoded. This process is repeated until all the windows in the block are decoded. The first and last windows are a special case in that the beginning and ends of the block are usually at known states for the convolutional code. Therefore, when processing the first window, only the backward learning period is required, and when processing the last window only the forward learning process is required.

In a preferred embodiment, all the windows are processed in parallel using N/L soft output decoders, corresponding to a N/L memory size increase and N/L throughput increase.

Table 1 summarizes approximately the memory, throughput, and computational requirements of the three prior art methods along with the preferred embodiment of the present invention. Entries in parentheses use an additional backward processor. Computational complexity includes both forward and backward processing. The present invention divides the trellis into N/L sections, and uses the bidirectional soft output decoder with window length A within each section.

TABLE 1

Comparison of the four methods for soft output decoding.

| Method | Memory Needed | Throughput | Computational Complexity |
|---|---|---|---|
| BCJR | NM words | ½ | 2NM state updates |
| Sliding Window | 0 words | 1/P | (P + 1)NM state updates |
| Viterbi Sliding Window | MA (2MA) words | ½ (1) | 3NM state updates |
| Present Invention | N/L*2MA words | N/L*2 | N/L*6NM state updates |

To illustrate the differences among the methods, Table 2 presents the results when typical values of sequence length (N=5000), number of states (M=8), window size (A=32), and sections (N/L=4) are used.

TABLE 2

Comparison among the methods for typical values of N, M, A and N/L.

| Method | Memory Needed | Throughput | Computational Complexity |
|---|---|---|---|
| BCJR | 40,000 words | ½ | 80,000 state updates |
| Sliding Window | 0 words | ½₃₂ | 1,320,000 state updates |
| Viterbi Sliding Window | 256 (512) words | ½ (1) | 120,000 state updates |
| Present Invention | 2048 words | 8 | 960,000 state updates |

As Table 2 shows, the memory requirements of the present invention are less than the BCJR method. The sliding window methods have much lower throughput than the present invention. Finally, note that in a circuit implementation, the number of gates required to process the trellis in N/L sections can be very reasonable. Also, although the computational complexity figure is large it is not unreasonable when using an application specific IC (non-DSP ASIC) where extra hardware is beneficial.

The present invention increases throughput and greatly reduces the memory required for a turbo decoder with only a small increase in complexity. For the turbo code within the 3GPP standard, the 40960 words of intermediate storage can be easily reduced to less than about 1500 words. In contrast, the prior art sliding window technique not only degrades performance but can require 10 to 15 times more computational complexity than the present invention.

While specific components and functions of the soft output decoder for convolutional codes are described above, fewer or additional functions could be employed by one skilled in the art within the broad scope of the present invention. The invention should be limited only by the appended claims.

What is claimed is:

1. A method of decoding a received convolutionally coded sequence of signals represented by a trellis of block length N, comprising the steps of:
   a) dividing the trellis into a plurality of sections;
   b) selecting a section of length L of the trellis,
   c) decoding a portion of the trellis using forward recursion from a point P1 to the beginning of the section, wherein P1 is before the beginning of the section and P1 is chosen at a sufficient distance from the beginning of the section such that forward recursion determines a known state metric at the beginning of the section;
   d) decoding a portion of the trellis using backward recursion from a point P2 to the end of the section, wherein P2 is after the end of the section and P2 is chosen at a sufficient distance from the end of the section such that backward recursion determines a known state metric at the end of the section;
   e) decoding the portion of the trellis within the section using a forward recursion starting from the known state at the beginning of the section defined in step c) and a backward recursion starting from the known state at the end of the section defined in step d);
   f) calculating a soft output at each stage of the section using the forward recursion state metrics defined in step f), the backward recursion state metrics defined in step f), and branch metrics at each state, and outputting the soft output for that stage; and
   g) performing the forward sand backward recursions of step e) and the soft output calculations of step f) with a sliding window decoding method within the section, wherein the sliding window decoding method is characterized by a window length A, wherein A is less than L.

2. The method of claim 1, wherein steps c) and d) includes each of the distance from the point P1 to the beginning of the section and the distance from the point P2 to the end of the section being less than or equal to the length L.

3. The method of claim 1, wherein the length P1 equals the distance from the point P1 to the beginning of the section equals the distance from the point P2 to the end of the section.

4. The method of claim 1, wherein step c) includes the distance from the point P1 to the beginning of the section and the distance from the point P2 to the end of the section are each a function of a constraint length of the convolutional code.

5. The method of claim 1, wherein the dividing step includes the length L being independent of a constraint length of the convolutional code.

6. The method of claim 1, wherein the decoding steps include a generalized Viterbi algorithm for decoding.

7. The method of claim 1, wherein the calculating step uses a maximum a posteriori (MAP) algorithm to calculate the soft output at each stage.

8. The method of claim 7, wherein the MAP algorithm of the calculating step includes one of the group of a log-MAP, MAP, max-log-MAP, and constant-log-MAP algorithm.

9. The method of claim 1, further comprising a step h) of repeating steps b) through g) until the entire block length N is decoded, wherein the repeated selecting step includes selecting any other next section, and wherein the repeated steps b) through g) concurrently with present steps b) through g), respectively.

10. The method of claim 1 wherein the sliding window decoding method is a bi-directional soft output decoder.

11. The method of claim 10 wherein a number of words of memory required for decoding the section is approximately 2MA, wherein M is a number of states in the trellis.

12. A method of decoding a received convolutionally coded sequence of signals represented by a trellis of block length N, comprising the steps of:
   a) dividing the trellis into sections of length L;
   b) decoding using a generalized Viterbi algorithm a portion of the trellis using forward recursion from a point P1 that is before the beginning of each section up to the beginning of that section, wherein P1 is a function of a constraint length of the convolutional code and is chosen at a sufficient distance from the beginning of the section such that forward recursion determines a known state metric at the beginning of the section;
   c) decoding using a generalized Viterbi algorithm a portion of the trellis using backward recursion from a point P2 that is after the end of each section back to the end of that section, wherein P2 is a function of a constraint length of the convolutional code and is chosen at a sufficient distance from the end of the section ection such that backward recursion determines a known state metric at the end of the section;
   d) decoding using a generalized Viterbi algorithm the portion of the trellis within each section using a forward recursion starting from the known state at the beginning of the section defined in step b) and a backward recursion starting from the known state at the end of the section defined in step c);

e) calculating a soft output at each stage of the section using the forward recursion state metrics defined in step d), the backward recursion state metrics defined in step d), and branch metrics at each stage, and outputting the soft output for that stage; and f) performing the forward and backward recursions of steps b) and c) and the soft output calculations of step e) with a sliding window decoding method within the section, wherein the sliding window decoding method is characterized by a window length A, wherein A is less than L.

13. A radiotelephone with a receiver and demodulator for processing a convolutionally coded sequence of signals represented by a trellis of block length N divided into sections of length L in a frame buffer by a soft-decision output decoder, the output decoder comprising:

a memory;

a forward recursion processor decodes a portion of the trellis using a learning forward recursion from a point P1 that is before the beginning of the section up to the beginning of the section, wherein P1 is chosen at a sufficient distance from the beginning of the section such that forward recursion determines a known state metric at the beginning of the section;

a backward recursion processor decodes a portion of the trellis using a learning backward recursion from a point P2 that is after the end of the section back to the end of the section, wherein P2 is chosen at a sufficient distance from the end of the section such that backward recursion determines a known state metric at the end of the section, the backward recursion processor subsequently decodes the portion of the trellis within the section using backward recursion starting from the known state at the end of the section back to the beginning of the section to define a set of known backward recursion state metrics within the section;

the forward recursion processor subsequently decodes the portion of the trellis within the section using forward recursion starting from a known state at the beginning of the section and moving forward to the end of the section to define a set of forward recursion state metrics within the section;

a decoder calculates a soft output at each stage of the section using the forward recursion state metrics, the backward recursion state metrics, and branch metrics at each state, and outputs the soft output for that stage; and performing the forward and backward recursions of the soft output calculations of within a sliding window decoding method within the section wherein the sliding window decoding method is characterized by a window length A, wherein A is less than L.

14. The radiotelephone of claim 13, wherein each of the distance from the point P1 to the beginning of the section and the distance from the point P2 to the end of the section is less than or equal to the length L.

15. The radiotelephone of claim 13, wherein the distance from the point P1 to the beginning of the section equals the distance from the point P2 to the end of the section.

16. The radiotelephone of claim 13, wherein the distance from the point P1 to the beginning of the section and the distance from the point P2 to the end of the section are each a function of a constraint length of the convolutional c.

17. The radiotelephone of claim 13, wherein the length L is independent of a constraint length of the convolutional code.

18. The radiotelephone of claim 13, wherein the forward and backward processors use a generalized Viterbi algorithm.

19. The radiotelephone of claim 13, wherein the decoder uses a maximum a posteriori (MAP) algorithm to calculate the soft output at each stage.

20. The radiotelephone of claim 19, wherein the MAP algorithm includes one of the group of a log-MAP, MAP, max-log-MAP, and constant-log-MAP algorithm.

21. The radiotelephone of claim 13, further comprising N/L additional memory, and forward and backward recursion processors for each section, wherein the memory, forward recursion processor and backward recursion processor operate to decode all the sections of the block in parallel.

* * * * *